United States Patent [19]

Provenzano et al.

[11] Patent Number: 5,104,850

[45] Date of Patent: Apr. 14, 1992

[54] PREPARATION OF HIGH TEMPERATURE SUPERCONDUCTING COATED WIRES BY DIPPING AND POST ANNEALING

[75] Inventors: Virgil Provenzano, Bethesda, Md.; Anand K. Singh, Middletown, N.J.; M. A. Imam, Annandale, Va.; Terry M. Tritt, Waldorf, Md.

[73] Assignee: The United States of America as represented by the Secretary of the Navy, Washington, D.C.

[21] Appl. No.: 486,639

[22] Filed: Feb. 28, 1990

[51] Int. Cl.$^5$ .................. H01B 12/04; B05D 5/12
[52] U.S. Cl. .................. 505/1; 427/118; 427/329; 427/434.6; 427/374.4; 427/419.4
[58] Field of Search .............. 505/1; 427/118, 324, 427/434.6, 374.4, 419.4

[56] References Cited

U.S. PATENT DOCUMENTS

| | | |
|---|---|---|
| 4,568,650 | 2/1986 | Coblenz et al. |
| 4,826,808 | 5/1989 | Yurek et al. ............... 505/1 |
| 4,940,693 | 7/1990 | Shappirio et al. .......... 505/1 |
| 4,971,948 | 11/1990 | Dam et al. ................. 505/1 |
| 5,011,823 | 4/1991 | Jin et al. ................. 427/376.2 |

FOREIGN PATENT DOCUMENTS 0304061 8/1988 European Pat. Off.

OTHER PUBLICATIONS

Akamatsu et al., Jpn J. Appl. Phys. 27(9), L1696-8 (Abstract only).
Shimomura et al., Jpn J Appl. Phys 27(10), L1890-1 (Abstract only).
A. D. Berry et al., "Formation of High $T_c$ Superconducting Films by Organometallic Chemical Vapor Deposition", extended abstract from a poster session during the Apr. 5 through 9, 1988 Syposium on High Temperature Superconductors II, Reno, Nev., pp. 141-143.
Jin et al., "Superconductor Wire by Molten Oxide Processing", Appl. Phys. Lett. 51(12), 21 Sep. 1987, pp. 943-945.
Khurana, "Super Collider Magnet-Program Pushes Toward Prototype", Physics Today, Apr. 1988, pp. 17-85.
Das, et al., "Casting High-$T_c$ Superconducting BiSCCO", printed in Journal of Superconducting, vol. 2, No. 2, 1989, pp. 253-263.
Provenzano et al., "Preliminary Studies for the Development of Superconducting Composite Wires", printed in IEEE Transactions on Magnetics, vol. 25, No. 2, Mar. 1989, pp. 2320-2322.

*Primary Examiner*—Shrive Beck
*Assistant Examiner*—Benjamin L. Utech
*Attorney, Agent, or Firm*—Thomas E. McDonnell; Barry A. Edelberg

[57] ABSTRACT

A high temperature superconducting coating of material oxide is produced by melting the metal oxide mixture, dipping a substrate, e.g. a platinum wire, in the metal oxide melt, withdrawing the substrate with a layer of metal oxide coated thereon, slowly cooling the metal oxide coating to avoid thermal shock and hot cracking, and post-annealing the metal oxide coating.

14 Claims, 6 Drawing Sheets

PREPARATION OF HIGH TEMPERATURE SUPERCONDUCTING COATED WIRES BY DIPPING AND POST ANNEALING

BACKGROUND OF THE INVENTION

1. Field of the Invention

This invention relates to a new process for coating a substrate with high-temperature superconductive metal oxides, and more specifically to a process for coating non-reactive wire or other substrate of high melting point by dipping into a mixture of molten metal oxide.

2. Description of the Prior Art

Superconductivity, the ability of a material to carry an electrical current without resistance, has been known since 1911. Superconductivity is observed below a critical temperature, the superconducting transition temperature, $T_c$, which is specific to each material. Above their superconducting transition temperature, materials have a finite electrical resistance. For many decades, the highest known superconducting transition temperature was 23K. Ever since the discovery by Bednorz and Muller in 1986 of a compound having a superconducting transition temperature of 35K, much has been devoted to finding superconducting materials having even higher superconducting transition temperatures. C. W. Chu discovered a composite having a transition temperature of 90K, and more recently, a composition having a transition temperature of 125K has been found. Any transition temperature above 30K is referred to high temperature. The rationale behind this effort is that the higher the superconducting transition temperature, the lower the refrigeration energy required to maintain the material in a superconducting state, and the less expensive it is to operate superconducting devices.

There are three principal high temperature superconductor compositions; yttrium-barium-copper oxide, with the metals in the atomic ratio of 1:2:3, referred to as "1-2-3", with a critical temperature $T_c$ of 93K; thallium-barium-calcium-copper oxide, with $T_c = 125K$; and bismuth-based copper oxides with $T_c$ as high as 110K The 1-2-3 composition has a relatively low $T_c$ and the product tends to be brittle. Thallium-containing compositions are unpopular because of the toxicity of thallium. Bismuth-containing compositions are believed to be the best of the three groups of compositions in that the $T_c$ is above 100K and they are easiest to process.

Following are examples of prior-art processes and compositions.

Japan Appl. No. 62-166098, published 13 Jan. 1989, entitled MANUFACTURE OF SUPERCONDUCTIVE FILM. A nitrate-mixed solution containing at least y, Ln, Ba, Sr, and Cu is coated on a substrate to form a superconductive film.

Japan Appl. No. 62-166499, published 13 Jan. 1989, entitled MANUFACTURE OF SUPERCONDUCTIVE THIN FILM discloses immersing a substrate in a molten solution of compounds containing group IIa and group IIIa and Cu whereby the molten solution sticks to the substrate to form a thin film. The substrate is then lifted out and cooled in the atmosphere and annealed at 800°-950° C. to form a ceramic superconductive thin film coating.

PHYSICS TODAY, pp. 17-25, April, 1988, discusses a basic building block of Bi-Ca-Sr-Cu-O (page 22) in the atomic ratio of 4:3:3:4. The product has two critical temperatures $T_c$, namely 85K and 110K.

APPL. PHYS. LETT. 51 (12), Sept. 21, 1987, pp. 943-945, discloses a preform-wire melting process. A ceramic/metal core composite superconducting wire is formed by remelting the outer shell of a Ba-Y-Cu oxide and heat treating with oxygen; it is said to have improved critical current density.

U.S. Pat. No. 4,826,808 discloses methods of preparing superconducting oxide from metallic elements to form a composite oxide which is formed into products by various methods such as plasma sputtering, gas atomizing, chemical vapor deposition, as well as dipping; thermal mechanical processing includes drawing, extrusion, pressing and rolling. The dipping process is carried out in vacuum or an inert atmosphere.

The processes including drawing, sputtering, vapor deposition, etc., all require complicated manufacturing procedures and precise control of the atmosphere under which the composition is processed. Therefore there is a need for a simple, inexpensive process for producing a high temperature superconducting material meeting specific industrial requirements.

SUMMARY OF THE INVENTION

It is the primary object of this invention to provide a novel process for coating a substrate of non-reactive metal of high melting point with a film of superconductive material having a high superconducting transition temperature. The process comprises dipping the substrate, precoated with a diffusion barrier such as MgO or other non-reactive material, into a bath of molten metal oxides including bismuth. The coated substrate is then cooled in stages to room temperature. Post-annealing is conducted at about 800° C. in the presence of air.

Another object is to provide articles produced by said process which have dense coatings with fine-grain microstructure.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DETAILED DESCRIPTION OF THE INVENTION

Figure 2:
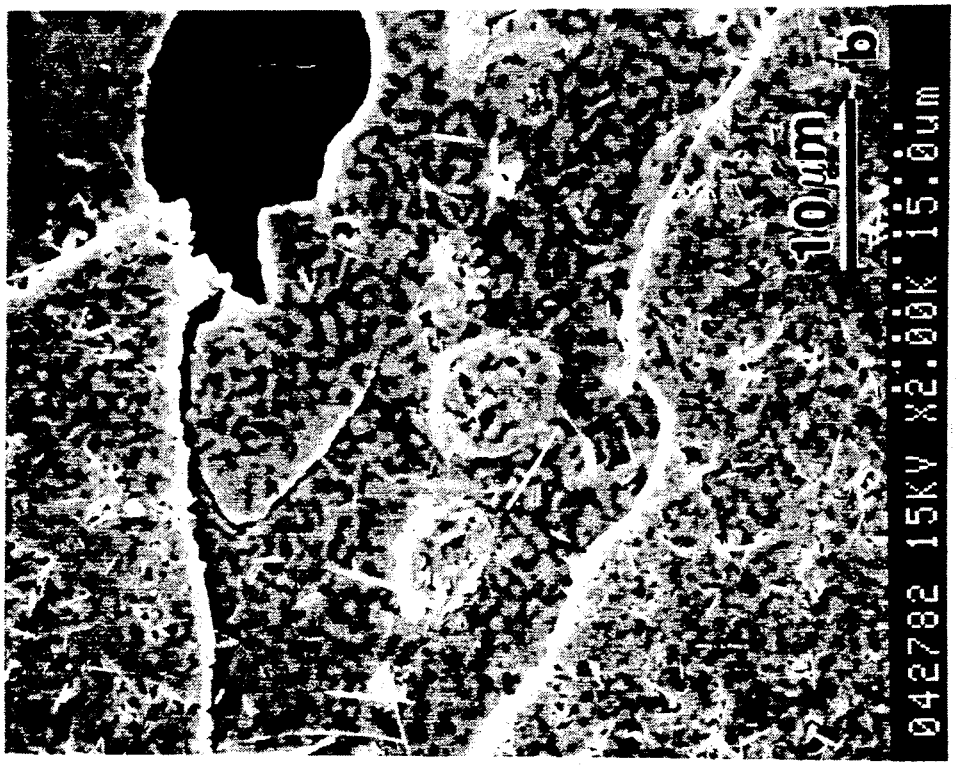
FIG. 2 is a higher magnification micrograph of the film of FIG. 1, showing needle-like features.

The term "high-temperature superconductivity" refers to superconducting transition temperatures above 30K. "Non-reactive" herein shall mean not reactive with the superconducting oxide at the melting temperature of the oxide. "High-melting" refers to a substrate melting temperature which is higher than that of the superconducting metal oxides.

The superconducting metal oxide is a mixture which may be formed into a perovskite. Generally, these mixtures include cuprates in admixture with oxides and carbonates of bismuth, strontium and calcium in powder form, such as a mixture of $Bi_2O_3$, $SrCO_3$, $CaCO_3$ and CuO, possibly with Ag and Pb lead and silver, supplied in elemental form, partially replacing bismuth in the perovskite matrix), with the metals having the atomic ratio $(2-x):2:2:3$, where x is the atomic proportion of Pb or Ag and may be about 0 to 0.15. Preferably, the perovskite contains bismuth. It is to be understood that the type of superconducting oxide is not limited by the above composition. Other compositions such as Bi-Sr-Ca-Cu-O in the atomic ratio $(2-x):2:1:2:6-7$ or in the ratio $(2-x):2:2:3:6-7$ are equally comparable. Zirconium and lead oxides may also be part of the mixture. The metal carbonates and oxides in the predetermined proportions are first calcined in air in a furnace for 6-10 hours, preferably 8 hours, at 700°-800° C., preferably about 750° C., and then finely ground and mixed to yield a uniform powder mixture. The time for calcination is dictated by the amount of mixture. This mixture is then placed in a non-reactive, high temperature crucible, preferably made of platinum or a ceramic material such as alumina-magnesia. The crucible is placed in a furnace and heated to form a melt of low viscosity, preferably at 1000°-1300° C., and most preferably at 1200° C. Virtually any furnace may be employed. Typically, the furnace uses electrical resistance heaters, and is open to the atmosphere so that the calcination takes place in presence of oxygen contained in the air. Any molydicilicide or muffle furnace is suitable.

A non-reactive, high-melting substrate such as platinum wire of platinum parts of any shape are pre-coated with a diffusion barrier whose purpose is to eliminate or reduce the interdiffusion between two dissimilar materials. Magnesium oxide or zirconium titanate are suitable diffusion barriers. The diffusion barrier materials must be nonreactive and have a higher melting point than the melting point of the superconducting metal oxide mixture.

The coated wire or substrate is dipped into the crucible containing the molten superconducting metal oxide mixture. The crucible used in this process is non-reactive and preferably made of platinum or a ceramic material. The manner in which the wire or substrate is introduced in the furnace and dipped into the melt is known to the art, such as galvanizing a steel wire by hard dipping. Such processes may be batch-wise or continuous. The time or immersion depends on the temperature of the molten superconducting mixture and the surface area of the substrate. Longer temperatures and longer times increase the coating thickness. Thus, the desired coating thickness may be varied as desired. For example, a platinum wire 3 millimeters in diameter requires 5-30 seconds immersion to produce a coating of superconducting metal oxides 1-2 millimeters in thickness at 1200° C. A flat MgO-coated substrate would have a coating 50-100 microns thick in the same immersion time.

After the desired thickness of a coated film is reached, the substrate is lifted out the molten oxide mixture and cooled in stages, to avoid thermal shock or hot cracking, to room temperature, preferably in air. For example, the coated substrate may be initially cooled to about 600.C. Once thermally equilibrated at that temperature, the sample may be subjected to furnace cooling or the equivalent. Thinly coated substrates may require less care during cooling than do more thickly coated substrates.

Post-annealing is conducted to restore $O_2$ to equilibrium levels and to relieve thermal stresses. Preferably, post annealing is done at about 800°-900° C., and most preferably at about 850° C., in air for about 3 to 12 hours and preferably 4 to 8 hours.

Having described the invention, the following examples are given to illustrate specific applications of the invention including the best mode now known to perform the invention. These specific examples are not intended to limit the scope of the invention described in this application.

EXAMPLES

Experimental Procedure

Bi-Sr-Ca-Cu-O films on MgO, pyrolytic graphite and silicon wafers were deposited by magnetron sputtering from single targets whose initial composition was $Bi_2Sr_2Ca_2Cu_3O_y$. The sputtering targets were prepared by a hot isostatically pressing (hipping) technique that is briefly described below. The films were sputtered in a 20 micron atmosphere of either argon or a mixture of 50% argon and 50% oxygen. The base pressure of the system before sputtering was $6 \times 10^{-7}$ Torr. During deposition the nominal temperature of the substrates was room temperature and the sputtering power ranged from 50 to 100 watts. Typical film thickness was approximately two microns.

The preparation of the sputtering targets consisted of the following steps. $Bi_2O_3$, $SrCO_3$, $CaCO_3$ and CuO powders in the ratio of 22:2:3 were first calcined in an air furnace for eight hours at 750° C. and the finely ground and mixed. The mixture was made into a pellet by hot pressing. The pellet was then isostatically pressed for one hour at 850° C. at a pressure of 207 MPa (30ksi) and cooled to room temperature. Additional details of target preparation by hipping are given elsewhere in Imam et al, Proceedings of the Applied Superconductivity Conference, San Fransisco, CA, 21-25 August 1988, incorporated herein by reference.

The calcined and blended mixture described above constituted the starting material used to prepare superconducting layers and wires by a dipping process. The calcined mixture was first place din a platinum crucible and the crucible was placed in an air furnace The temperature of the furnace was raised to 1200° C. This temperature caused the mixture to melt and have a low viscosity. Platinum wires, previously coated with MgO paste, and MgO coupons were briefly dipped in the molten bath. The crucible was then removed from the furnace and the wires and the coupons were quickly taken out of the bath and allowed to cool to room temperature. Typical thickness of the superconducting layer on the platinum wires was 1-2 millimeters, whereas on the MgO coupons it was 50-100 microns. Post annealing treatments for the different specimens were conducted in air.

The compositions of the sputter-deposited films and of the dipped specimens were determined by Rutherford backscattering and by energy dispersive X-ray analysis. X-ray diffraction measurements were performed using Cu K$\alpha$ radiation to characterize the crystallographic features of the films. The microstructures of the deposited films and of the dipped specimens were examined by optical and by scanning electron microscopies. Resistance versus temperature curves of the samples were measured using a standard four terminal technique with the terminal contacts made with indium solder joints.

Experimental Results

Figure 1:
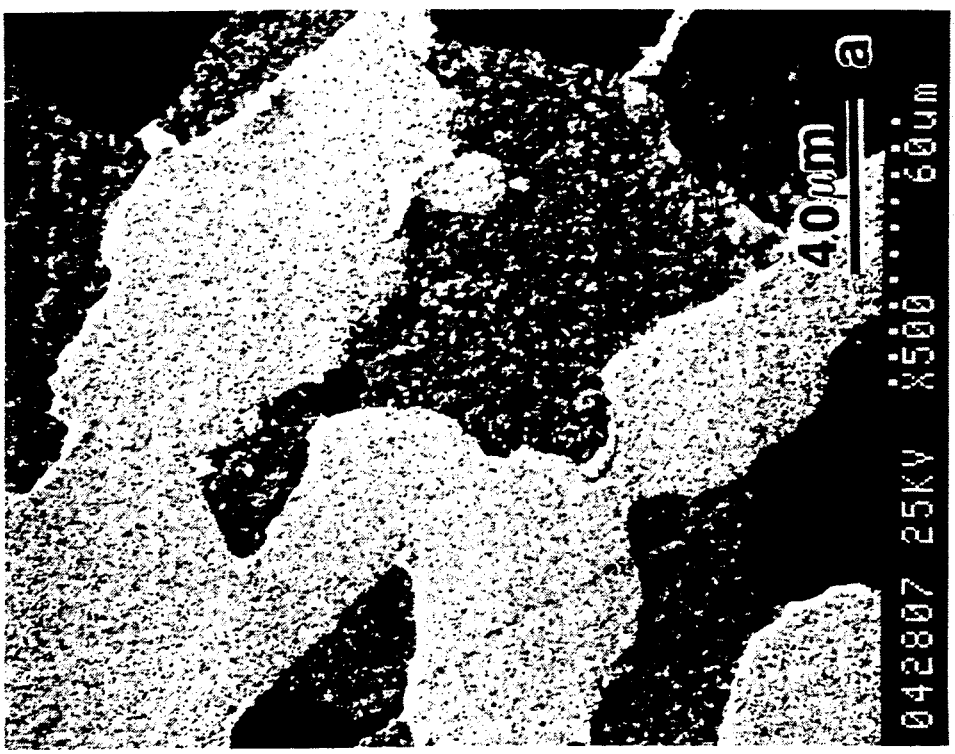
FIG. 1 is a scanning electron micrograph (SEM) of Bi-Sr-Ca-Cu-O sputtered film on MgO substrate showing the layered microstructure that resulted when the sputtering power was changed during deposition.
Figure 4:
FIG. 4 is a higher magnification micrograph of the film of FIG. 3.
Figure 3:
FIG. 3 is a SEM micrograph of Bi-Sr-Ca-Cu-O sputtered film on MgO substrate deposited in an argon atmosphere.

The SEM micrographs presented in FIG. 1 show the morphology of a Bi-Sr-Ca-Cu film deposited on a MgO substrate in the Ar/O atmosphere and annealed for 15 minutes at 850° C. During deposition the sputtering power was changed from 50 to 100 watts. After the heat treatment, the film exhibited a layered structure. In some places the bottom layer is visible because the top layer has peeled off. Energy dispersive X-ray analysis showed that the top layer was slightly richer in Cu and slightly poorer in Ca when compared to the bottom layer. It is possible that the change in sputtering power during deposition produced a changed in composition at between the two layers. This change in composition probably resulted in the formation of a different phase with poor interfacial adherence. Besides the layering, FIG. 2 shows the needle-like crystallites formed in the deposited film. Sputtering deposition in an argon atmosphere produced films that were less continuous than the film shown in FIGS. 1 and 2. FIGS. 3 and 4 show the "islanding" that occurred in these films after the annealing treatment. The SEM micrographs in FIGS. 3 and 4 show the terrace-like structure of the crystallite islands that is consistent with the c-axis alignment discussed below.

Figure 5:
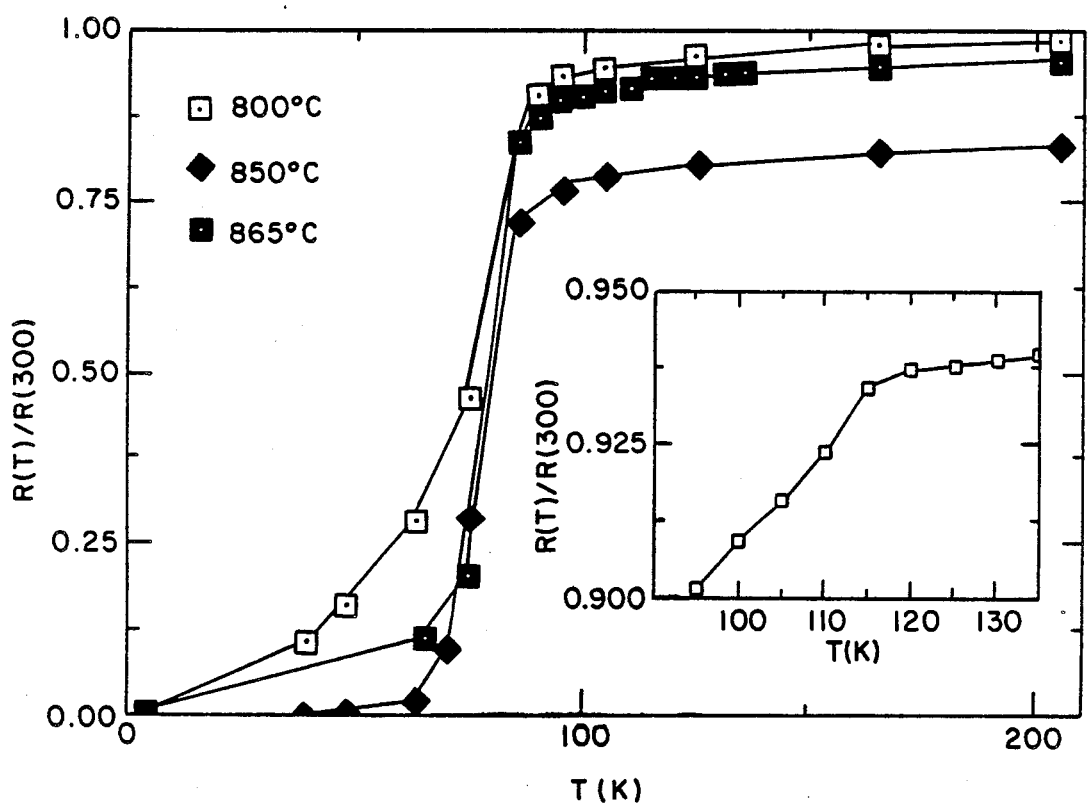
FIG. 5 is a normalized plot of resistivity R(T)/R(300K) verses T for the film shown in FIG. 1, after three heat treatments: 10 minutes at 800° C., 15 minutes at 850° C., and 15 minutes at 865° C. The inset shows the onset of superconductivity at 115K after the 865° heat treatment.
Figure 6:
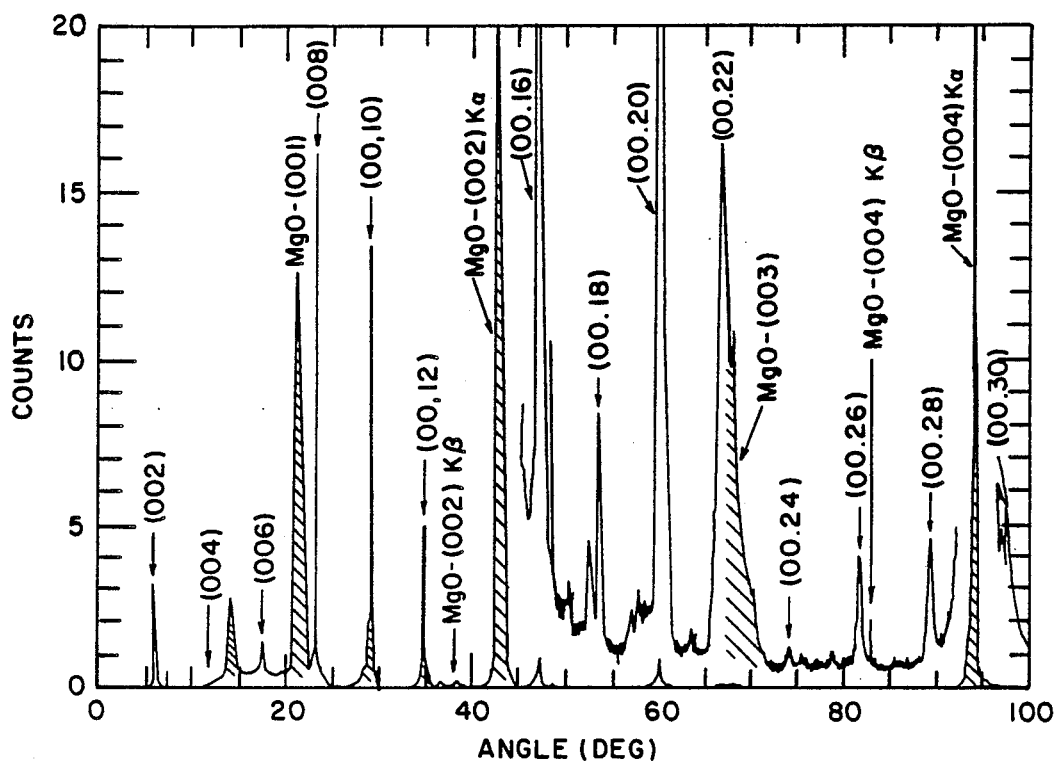
FIG. 6 is an X-ray diffraction spectrum of a film produced according to the present invention after its last heat treatment. The cross-hatched peaks are both Bragg and "forbidden" reflections from the single-crystal MgO substrate; all of the remaining major peaks can be indexed to the metal-oxide (00L) reflection ($2 \leq L \leq 30$) in the tetragonal lattice. (The portion of the spectrum above 45° was replaced with the ordinate scale decreased by 100.)

FIG. 5 shows a plot of the normalized resistivity R(T)/R(300K) versus T for the film presented in FIGS. 1 and 2. After the first heat treatment, T-800° C., the onset of the superconducting transition occurred at 85K, but the transition is broad. Annealing the film at 850° C. did not significantly change the onset temperature but it did sharpen the transition significantly. A third anneal of the film at 865° C. produced two effects. First, the transition temperature was broader. Secondly, the resistivity curve at 115K suggests that part of the film was superconducting at this temperature (see in the inset in FIG. 5). These changes in the resistivity curve after the third heat treatment could be the result of formation of new phases in the film. After each heat treatment, X-ray diffraction measurements were performed using CuK$\alpha$ radiation. FIG. 6 shows a diffraction spectrum taken of the above film after the third heat treatment. The cross-hatched peaks in the figure are from the MgO substrate; most all other peaks can be indexed to (OOL) reflections (2<L<30) of the structure reported by Tarascon et al in 1988 for nominal composition $Bii_2(Sr, Ca)_3Cu_2O_{8+x}$ or equivalently to that reported by Zandborgen et al, *Solid State Commun.*, 66, p 397 (1988), for composition $Bi_2Sr_2CaCu_2O_x$. The c-axis lattice parameters associated with these is 30.705+0.008Å. The X-ray diffraction patterns taken after the earlier heat treatments were qualitatively similar to the pattern shown in FIG. 6. None of the patterns taken after the three heat treatments shows the presence of additional phases. The X-ray diffraction measurements show only a single phase which was identified as the n=2 phase.

Figure 7:
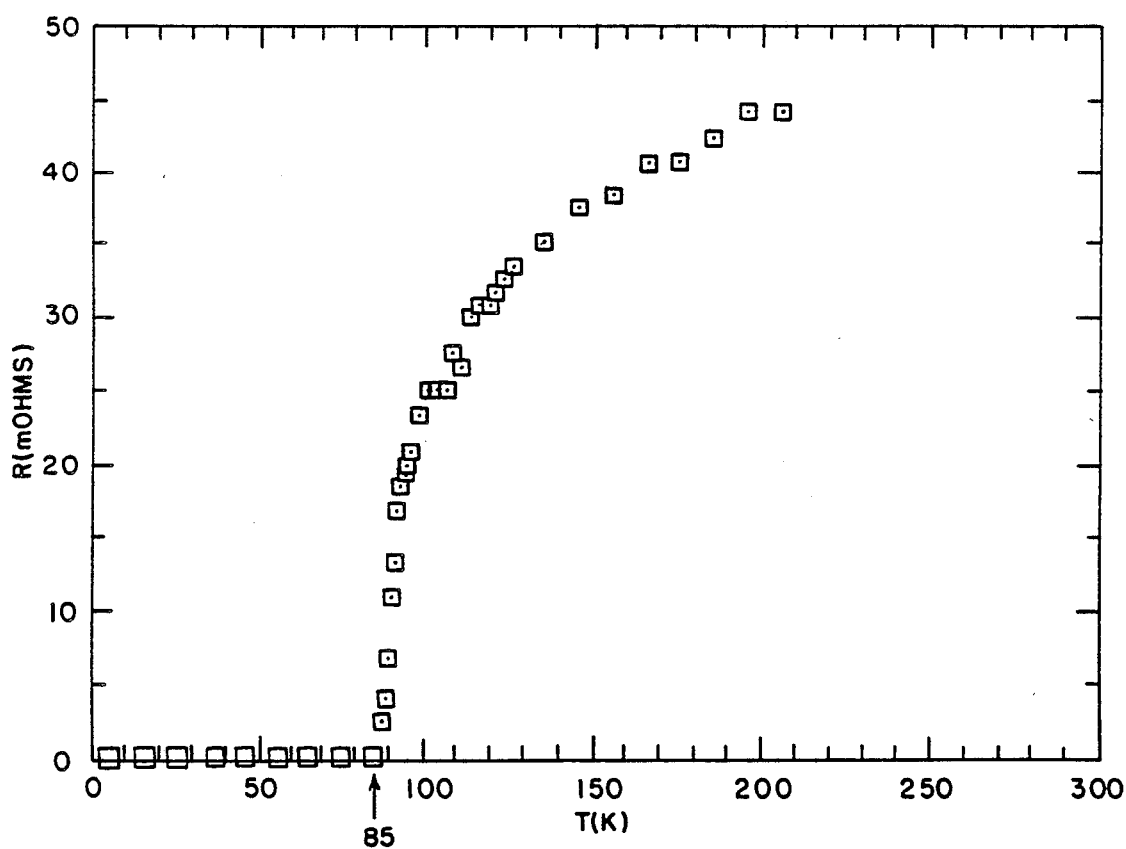
FIG. 7 is a plot of resistance versus temperature, T, for Bi-Sr-Ca-Cu-Olayer on a platinum wire. Prior to resistance measurements the wire was annealed for 12 hours at 850° C. The plot shows $T_c$ onset at 115K with zero resistance at 85K.
Figure 8:
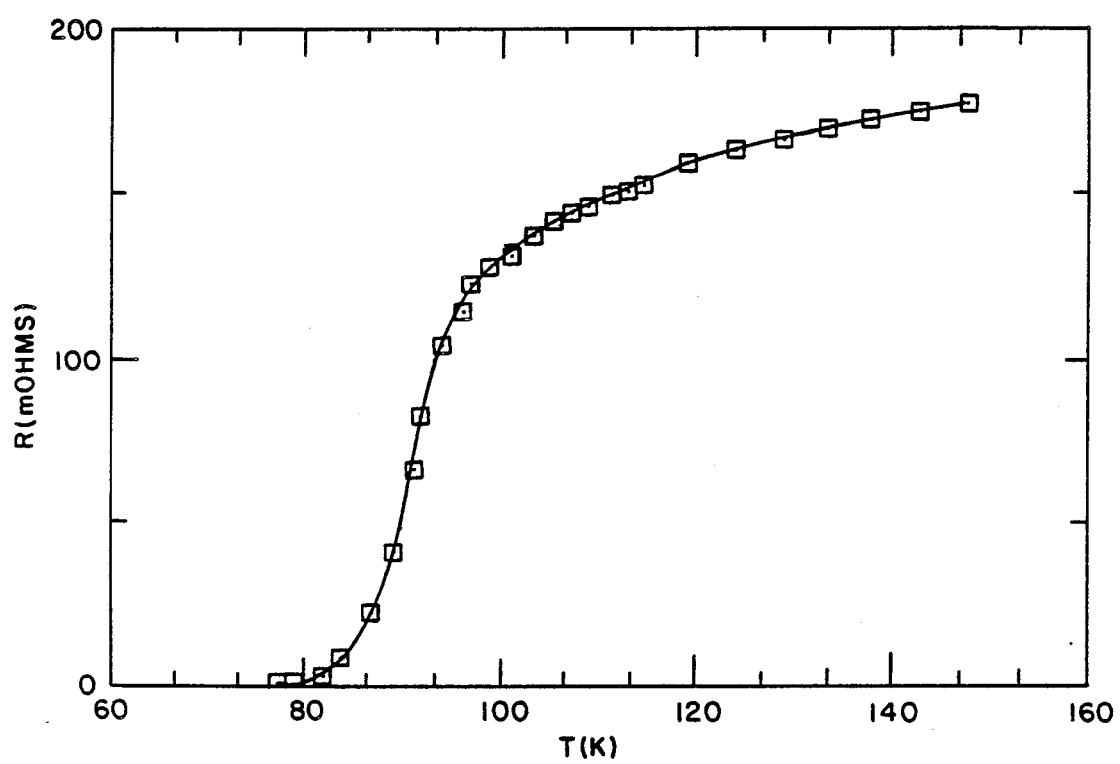
FIG. 8 is a plot of resistance versus temperature, T, for Bi-Sr-Ca-Cu-O layer deposited on a MgO substrate by dipping. Specimen coupon annealed for 12 hours at 850° C. prior to resistance measurements. The plot show $T_c$ onset at 110K with zero resistance at 80K.
Figure 10:
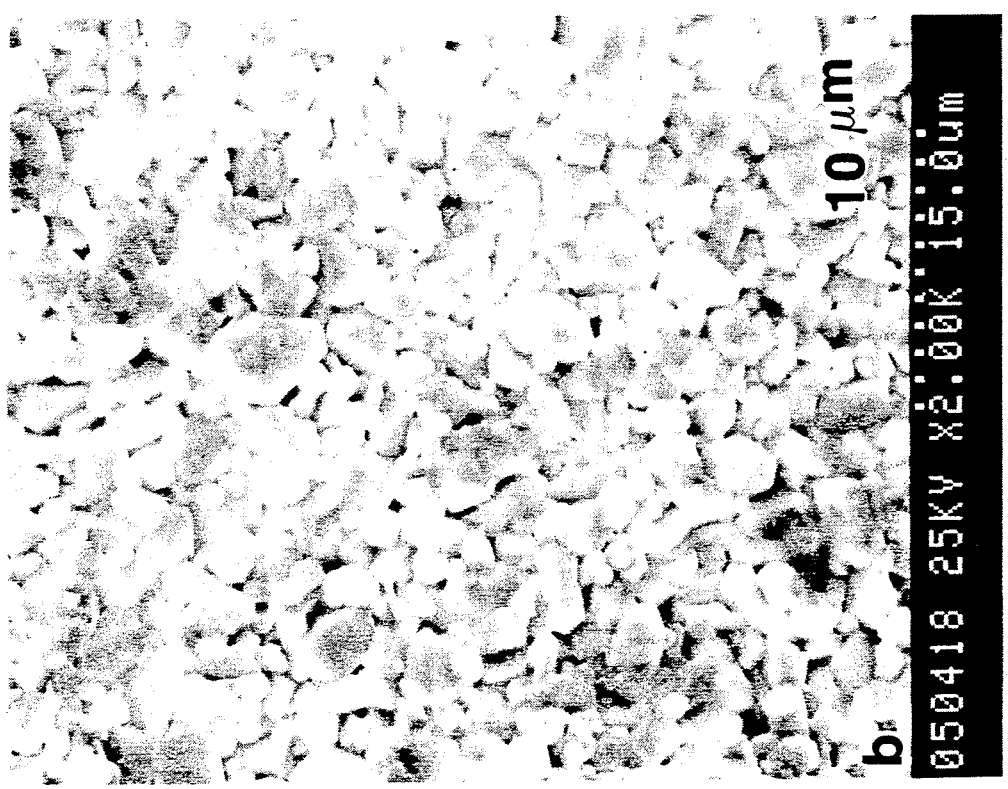
FIG. 10 is a higher magnification micrograph of the coating shown in FIG. 9 showing the dense, fine-grained microstructure.
Figure 9:
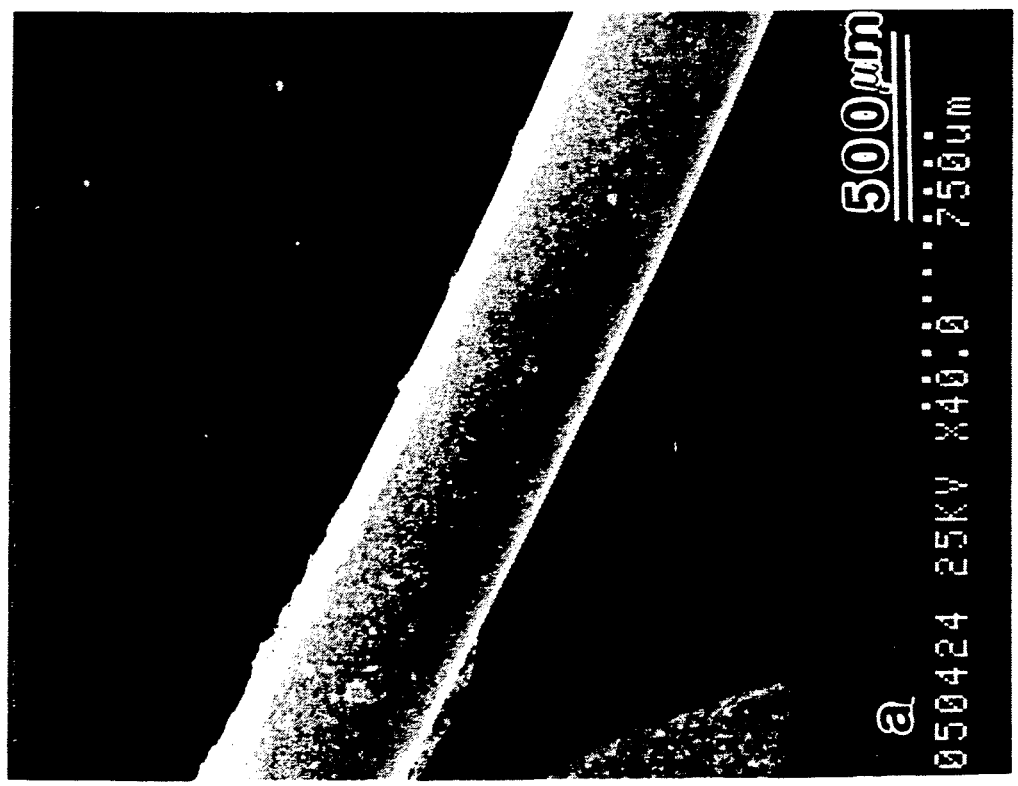
FIG. 9 is a SEM micrograph taken of the Bi-Sr-Ca-Cu-O coated platinum wire after 12 hours annealing at 850° C., showing that the superconducting layer is relatively uniform.

The resistance versus temperature of the coated platinum wire, presented in FIG. 7, shows excellent superconducting properties of the wire with $T_c$ onset at 115K and zero resistance at 85K. The resistance versus temperature of the dipped MgO coupons, presented in FIG. 8, shows similar results with the $T_c$ onset occurring at 110K and zero resistance at 80K. The SEM micrograph at lower magnification presented in FIGS. 9 and 10. shows the platinum wire after it had been coated with the Bi-Sr-Ca-Cu-O material. This micrograph shows that the deposited layer is fairly uniform in thickness (FIG. 9). The higher magnification SEM micrograph (FIG. 10) of the wire after annealing shows that the superconducting layer is dense and has a very fine microstructure (2-5 $\mu$m diameter grain size). Although not shown for the sake of brevity, the microstructural features of the superconducting layer on the MgO coupons after the annealing treatment were similar to those shown in FIG. 10. The average thickness of the deposited layer on the platinum wires was about 2 mm whereas the thickness of the layer on the MgO coupons was about 100 $\mu$m. X-ray diffraction analysis of the dipped layers on the wires and on the MgO coupons after the post-annealing treatment showed crystallographic features similar to those observed in the sputtered films on the MgO substrates shown in FIG. 6. Preliminary transport property measurements on the dipped platinum wire shown in FIGS. 9 and 10, resulted in a $J_c$ value of about 80 amp/cm$^2$. Because of experimental difficulties, $J_c$ values of the sputtered films and layers on the MgO substrates have yet to be determined.

It has been shown how the heat treatment and sputtering conditions (sputtering rate and sputtering atmosphere) affect the microstructure and the superconducting properties of Bi-Sr-Ca-Cu-O films deposited on MgO substrates. The film used for the heat treatment study is tetragonal and it has an average composition suggested by others for the n=3 phase ($T_c$=110K). Despite the composition being close to n=3 phase, the film was primarily of the n=2 phase, i.e., its c-axis lattice parameter and the superconducting critical temperature corresponds to the n=2 phase. The observed sensitivity of the superconducting transition temperature to the heat treatment suggests the presence of other phases that were not detected by X-ray diffraction measurements. In particular, the effect of the third heat treatment of the film at 865° C. on the superconducting transition temperature is consistent with a partial decomposition of the $n=2$ phase into $n=1$ and $n=3$ phases. Others in the art have suggested that the $n=2$ phase is unstable and it decomposes into $n=1$ and $n=3$ phases. In the present sputtered deposited films it is possible that either the $n=1$ and $n=3$ phases are only present in small amounts or they are very similar to the $n=2$ majority phase. The films are highly textured with c-axes of the crystallites perpendicular to the phase of the substrate. It also appears that the crystallites have their a-axes in two preferred orientations. One orientation is parallel to the MgO-(100) axis and the other rotated by 45° with respect to the substrate axis.

Additionally, a simple and inexpensive process has been described that was developed to deposit Bi-S-Ca-Cu-O superconducting layers on wires and on flat coupons by dipping. The $T_c$ onset of the layers on the wires occurred at 115K, whereas the $T_c$ onset of the layers on the Mgo coupons occurred at 100° K with zero resistance 85K for the wires 80K for the MgO coupons. The deposited layers, both on the wires and on the MgO coupons, exhibited a fine grained microstructure after the annealing treatment; the layers were dense, adherent and of fairly uniform in thickness. One of the advantages of the dipping process is that it can be used to deposit Br-Sr-Ca-Cu-O material on complex shaped components.

Applications for superconducting materials include electromagnetic wave shields and wave guides, magnetic levitation for high-speed trains, electric power transmission and energy storage for load levelling for utilities, electromagnetic launch systems for Earth satellites, subatomic particle accelerators, and many more.

Further details regarding the present invention may be found in Provenzano et al, "Preliminary Studies for the Development of Superconducting Composite Wires", *IEEE Transactions on Magnetics*, Vol. 25, No. 2 (March 1989), incorporated herein by reference.

It will be understood that the above description of the present invention is susceptible to various modifications, changes and adaptations, and the same are intended to be comprehended with the meaning and range of equivalents of the appended claims.

What is claimed is:

1. A process for coating a film on a wire substrate comprising:
   melting a superconducting metal oxide mixture in a crucible to form a melt;
   coating the substrate with a diffusion barrier;
   dipping said coated wire substrate into the melt;
   cooling said coated wire substrate at a rate sufficiently slow to avoid thermal shock and hot cracking; and
   post-annealing the cooled, coated wire substrate to relieve thermal stresses in said coating, whereupon said superconducting metal-oxide mixture forms a perovskite coating upon said wire substrate.

2. The process of claim 1 wherein said superconducting metal-oxide mixture forms a bismuth-containing perovskite coating upon said wire substrate.

3. The process of claim 2 wherein the superconducting metal oxide mixture comprises an admixture of oxides and carbonates of Bi, Sr, Ca, and Cu.

4. The process of claim 3, wherein said superconducting oxide mixture comprises Bi, Sr, Ca and Cu in the atomic ratio $(2-x):2:2:3$, where x is the atomic proportion of Ag or Pb and is 0 to about 0.15.

5. The process of claim 1, wherein said wire substrate is initially cooled by equilibration down to about 500° to 700° and then air cooled.

6. The process of claim 1, wherein said wire substrate is furnace cooled.

7. The process of claim 1 wherein the superconducting metal oxide mixture is produced by the calcination of $Bi_2O_3$, $SrCO_3$, $CaCO_3$ and CuO, with the metals in the atomic ratio 2:2:2:3.

8. The process of claim 1 wherein the superconducting metal oxide mixture is melted at 1000–1300 deg. C.

9. The process of claim 1 wherein the diffusion barrier is magnesium oxide or zirconium titanate.

10. The process of claim 9 wherein the diffusion barrier is magnesium oxide.

11. The process of claim 9 wherein the diffusion barrier is zirconium titantate.

12. The process of claim 1 wherein the dipping is performed for about 5 to 15 minutes.

13. The process of claim 1 wherein the wire substrate is platinum.

14. The process of claim 1, wherein said precoated wire substrate is dipped into said melt in a continuous manner.

* * * * *